United States Patent [19]
Brown

[11] Patent Number: 5,198,887
[45] Date of Patent: Mar. 30, 1993

[54] SEMICONDUCTOR CHIP CARRIER

[75] Inventor: Vernon L. Brown, Barrington, Ill.

[73] Assignee: Motorola, Inc., Schaumburg, Ill.

[21] Appl. No.: 665,058

[22] Filed: Mar. 6, 1991

[51] Int. Cl.⁵ .............................................. H01L 23/02
[52] U.S. Cl. ................................... 361/383; 257/733; 257/722
[58] Field of Search ............... 361/386, 387, 400, 403, 361/413; 357/74, 80, 81

[56] References Cited
U.S. PATENT DOCUMENTS

| | | | |
|---|---|---|---|
| 4,509,096 | 4/1985 | Baldwin et al. | 361/386 |
| 4,700,276 | 10/1987 | Freyman et al. | 361/403 |
| 4,700,473 | 10/1987 | Freyman et al. | 29/846 |
| 4,717,989 | 1/1988 | DeBarros et al. | 361/424 |
| 4,783,697 | 11/1988 | Benenati et al. | 357/80 |
| 4,825,284 | 4/1989 | Soga et al. | 357/80 |
| 4,890,152 | 12/1989 | Hirata et al. | 357/72 |

OTHER PUBLICATIONS

Motorola, Inc., "Semiconductor Data Update", vol. 9, No. Mar. 5, 1989 p. 4.

Primary Examiner—Frank Gonzalez
Attorney, Agent, or Firm—Raymond A. Jenski

[57] ABSTRACT

A semiconductor chip carrier (SCC) comprising means for physical orientation and attachment to a substrate which is independent of means for coupling electrical signals to the substrate, thereby alleviating many of the constraints often placed on the substrate and/or electrical coupling system.

4 Claims, 1 Drawing Sheet

SEMICONDUCTOR CHIP CARRIER

FIELD OF THE INVENTION

This invention relates to semiconductor chip carriers and more particularly to high input-output (IO) count semiconductor chip carriers.

BACKGROUND OF THE INVENTION

Semiconductor chip carriers (SCC), in addition to providing protection for the semiconductor chips, must also provide a means for physical attachment to other portions of a composite assembly of components, some means for coupling electrical signals into and out of the semiconductor chip, and some means for dissipating thermal energy generated by the semiconductor chip. Semiconductor technology continues to advance, creating denser, more complex and higher (IO) count semiconductor chips which generate more thermal energy. At the same time the electronics market is placing a premium on component assembly density. All of this has combined to dramatically drive semiconductor chip carrier IO density up.

Previous advances in technology have addressed in various ways all of the above problems, in isolation, for example, thermal dissipation in power semiconductors often dictates a package mounted by some form of threaded mechanical fastener or IO density via a TAB package. Other reasonable compromise solutions to all three of the above requirements for SCCs have been demonstrated previously.

Representative of the art today are various SCCs which are mounted by soldering, often via a solder reflow process, each IO contact pad to a respective contact pad on a substrate. With this approach the sum total of all solder joints provides the mechanical orientation and attachment to the substrate, to some extent a path for conducting thermal energy away from the SCC, and the requisite electrical coupling. This dependence on the solder joints for all three functions places severe constraints on these joints as well as the underlying characteristics of the substrate. Generally the solder joints must be strong and resilient enough and therefore large enough to accomplish these mechanical functions and thermal duties without failing or causing intermittent electrical coupling.

To achieve modest levels of joint density, the underlying substrates are usually carefully chosen to have temperature expansion characteristics closely matched to those of the SCC. This approach, at best a compromise, requires still more care to characterize temperature differences between the SCC and its substrate so as to avoid undue stress on the solder joints from differential expansion.

If all the above issues are carefully addressed the solder joint size can be somewhat reduced and therefore potential joint density increased at least to modest levels, at modest levels of thermal dissipation. As is readily observed this dependence on the electrical coupling means for all the requisite functions of an SCC severely constrains the breadth of circumstances and potential application of previously known SCCs.

SUMMARY OF THE INVENTION

In accordance with one aspect of this invention there is provided a semiconductor chip carrier (SCC) having a first surface which may be mounted or attached to a substrate, for example, a printed wiring board. This SCC has means for coupling electrical signals, such as electrical contact pads, to the substrate disposed on the first surface. In addition means for physically coupling the semiconductor chip carrier to the substrate have been provided. These means include a second surface located a predetermined distance from the first surface, arranged to be in contact with the substrate, and at least one stud member adapted for urging the means for coupling electrical signals to a second predetermined distance from the substrate by causing the physical contact between the second surface and the substrate. Thus the present invention provides an SCC that does not rely on the means for coupling electrical signals to provide means for physical coupling.

BRIEF DESCRIPTION OF THE DRAWING

The FIGURE shows a cross sectional side view of a semiconductor chip carrier physically coupled to a substrate.

DETAILED DESCRIPTION OF A PREFERRED EMBODIMENT

Figure 1:
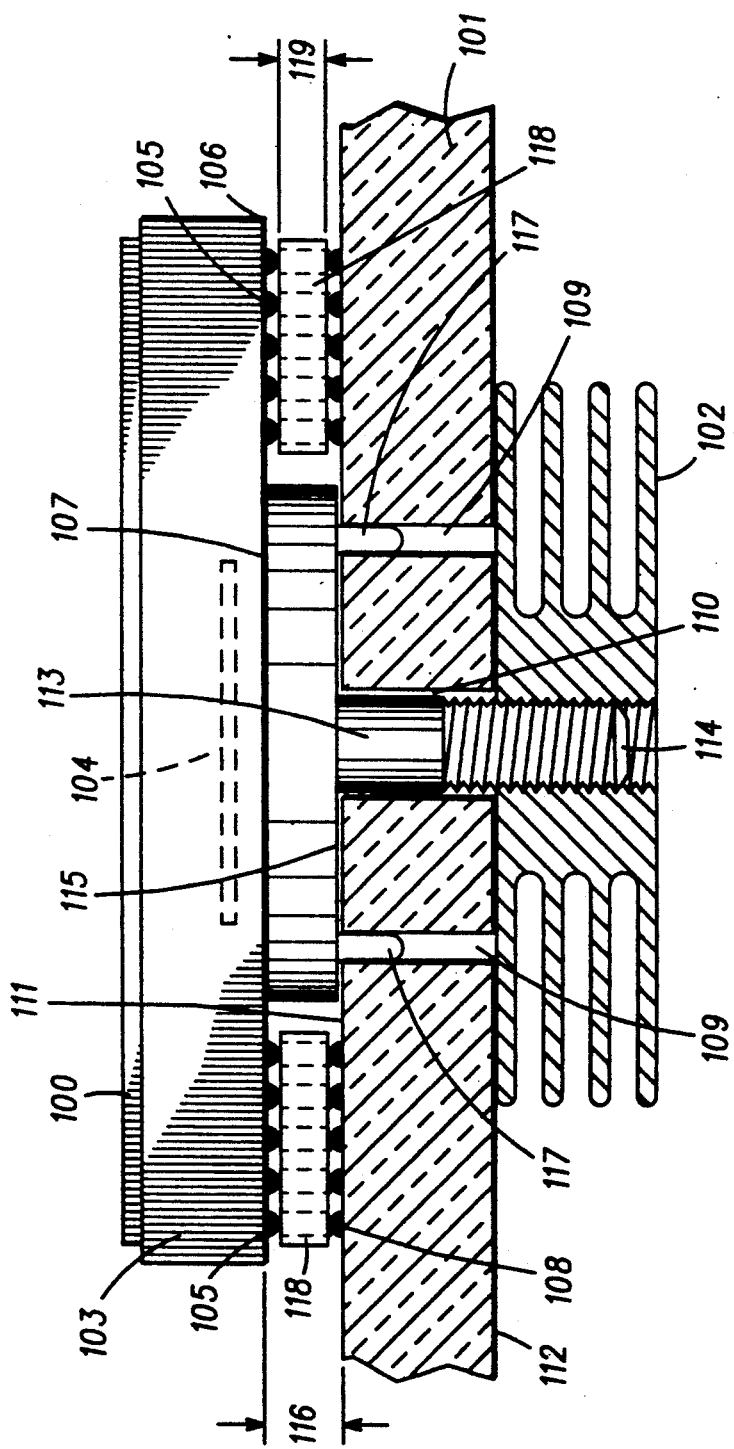

The preferred embodiment of this inventive semiconductor chip carrier is shown as used in the cross sectional side view of the FIGURE. Shown in this FIGURE is a substrate 101 physically sandwiched between the semiconductor chip carrier (SCC) 100 and a threaded heatsink 102.

The substrate 101 can be a broad range of materials including printed wiring boards (PWB) constructed with glass epoxy such as FR4, polyimide, Kevlar, or ceramic composites. The substrate 101 has electrical contact pads 108 at predetermined locations on a top surface 111, and openings or thru holes 109, 110, from the top surface 111 to a bottom surface 112.

The SCC 100 includes a carrier with cavity 103 therein adapted to physically carry and protect a semiconductor chip 104 which is thermally proximate to a surface 107. Carrier surface 106 has a predetermined dimensional and proximal relationship to carrier surface 107 such that electrical contact pads 105 may be electrically coupled to predetermined input and output nodes of IC 104 via techniques well known in the art. Another element of SCC 100 is the mechanical attachment device 113, physically attached in a predetermined location to the carrier and thermally proximate to surface 107. The mechanical attachment device 113 includes a stud member 114 extending thru hole 110 in substrate 101, a surface 115 in physical contact with surface 111 of substrate 101 at a predetermined distance 116 from surface 106, and physical location and orientation posts 117 having a predetermined longitudinal location relationship to contact pads 105 disposed in thru holes 109. Stud member 114 which is constructed of copper in the preferred embodiment, is shown threaded with heatsink 102 installed, securing the physical contact between top surface 111 and surface 115. Thermal energy produced by semiconductor chip 104, available at surface 107 is conducted through the relatively low thermal resistance of stud member 114 to heatsink 102.

The predetermined locations above are chosen such that electrical contact pads 105 on surface 106 and electrical contact pads 108 have, within acceptable tolerances, some predetermined longitudinal relationship to each other, for example directly above and below each other. An elastomeric pad 118 is compressed between solder SCC 100 and substrate 101 completing the electrical connections between respective contact pads 105 and contact pads 108. Alternatively, the electrical contact pads may be conventionally soldered thereby providing electrical connections.

The physical contact between surface 115 and surface 111, in conjunction with dimension 116 and the predetermined dimensional relationship between surface 107 and surface 106, substantially determines the vertical dimension 119 between respective contact pads 105 and 108. Therefore by appropriate selection of dimension 116 vertical dimension 119 may be adjusted allowing a variety of different apparatus for completing the electrical coupling between contact pads 105 and 108, for example collapsible solder balls or bumps or posts, various thicknesses of elastomeric pads, conductive epoxy, different formulations of solder, etc.

Although the mechanical attachment device 113 is shown as one composite entity it is clear that it may be embodied as at least the three separate entities of the stud element 114 a dimension 116 determining element and the physical location and orientation determining posts 117. In fact it is preferable to have the location and orientation features located closer to the perimeter of cavity 103 to minimize mechanical location tolerance effects.

Even though the stud element 114 has been constructed of copper in the preferred embodiment, it does not have to have low theremal resistance or be fabricated in metal, unless the amount of thermal energy being generated by semiconductor chip 104 requires the additional heat sinking effect. Similarly the method of securing the stud element 114, (in the preferred embodiment, a threaded heatsink 102) can take many forms for example riveting, rolling, pinning, c-washer, etc.; depending on the specific mechanical and thermal constraints of a given application.

What has been described is an inventive semiconductor chip carrier which has solved the problems inherent in the art by addressing the physical coupling and thermal energy dissipation requirements of an SCC in a manner that allows the electrical coupling requirements to be independently addressed and optimized thereby creating a higher electrical IO count SCC without compromising the SCCs physical or thermal capability.

I claim:

1. A semiconductor chip carrier having at least a first surface and which is mountable on a substrate, the semiconductor chip carrier comprising:
   means, disposed on the first surface, for coupling electrical signals to the substrate; and
   means for physically coupling the semiconductor chip carrier to the substrate, said means for physically coupling further comprising at least one stud member and a second surface disposed at a first predetermined distance from the first surface and arranged to be in physical contact with the substrate, said at least one stud member capable of urging said means for coupling electrical signals to a second predetermined distance from the substrate.

2. The semiconductor chip carrier of claim 1 wherein said means for coupling electrical signals further comprises contact pads.

3. The semiconductor chip carrier of claim 1 wherein said at least one stud member further comprises means for providing a path of high thermal conductivity.

4. The semiconductor chip carrier of claim 1 wherein said at least one stud member further comprises a threaded portion.

* * * * *